United States Patent [19]

Murayama et al.

[11] Patent Number: 5,287,047
[45] Date of Patent: Feb. 15, 1994

[54] MOTOR DRIVE CIRCUIT AND MOTOR DRIVE SYSTEM USING THE SAME

[75] Inventors: Yorinobu Murayama, Moriguchi; Kenji Otani, Kyoto, both of Japan

[73] Assignee: Rohm Co., Ltd., Kyoto, Japan

[21] Appl. No.: 847,275

[22] Filed: Mar. 10, 1992

[30] Foreign Application Priority Data

Mar. 15, 1991 [JP] Japan ................... 3-075855
May 30, 1991 [JP] Japan ................... 3-155798

[51] Int. Cl.⁵ .................... H01L 25/00; H02P 3/08
[52] U.S. Cl. ................... 318/362; 318/293; 307/303.1
[58] Field of Search .................. 437/180, 909; 307/465.1, 482.1, 303, 303.1; 357/40, 46, 47; 318/293, 362

[56] References Cited

U.S. PATENT DOCUMENTS

| | | | |
|---|---|---|---|
| 3,829,709 | 8/1974 | Maigret et al. | 307/202 |
| 3,967,295 | 6/1976 | Stewart | 357/51 |
| 4,112,670 | 9/1978 | Morozumi | 357/43 X |
| 4,302,718 | 11/1981 | Schade, Jr. | 323/313 |
| 4,933,573 | 6/1990 | Takeda et al. | 307/296.2 |
| 4,937,467 | 6/1990 | Tuska et al. | 307/264 |
| 4,989,114 | 1/1991 | Storti et al. | 361/84 |
| 5,075,577 | 12/1991 | Okitaka | 307/473 |

*Primary Examiner*—Bentsu Ro
*Attorney, Agent, or Firm*—Fay, Sharpe, Beall, Fagen, Minnich & McKee

[57] ABSTRACT

A motor drive circuit, in which a first transistor at a drive stage, a second transistor at an output stage to be driven by the first transistor and a third transistor downstream the output stage for a short braking operation are formed in a common substrate or a common well of the substrate, a region of either a P type or an N type in either the substrate or the well is connected with the first transistor via a conductor so that a parasitic transistor is formed in which the substrate or the well serves as its base, whereby a current flowing from the first transistor to the second transistor during the short braking operation is sinked by turning on the parasitic transistor.

25 Claims, 6 Drawing Sheets

MOTOR DRIVE CIRCUIT AND MOTOR DRIVE SYSTEM USING THE SAME

BACKGROUND OF THE INVENTION

1. Field of the Invention

The present invention relates to a motor drive circuit and a motor drive system using the same, and more particularly relates to a motor drive circuit formed in an IC which prevents a transistor in the output stage thereof from being damaged when the motor is in a short-braking operation.

2. Background Art

FIG. 6 is a circuit diagram showing an example of conventional motor drive circuits. FIG. 7 is a view showing a structure of transistors Q1, Q2 and Q3 on a semiconductor chip when the motor drive circuit in FIG. 6 is formed in an IC.

The transistor Q1 is a PNP type transistor which drives the transistor Q2 at the output stage, and the emitter of the transistor Q1 is connected to a power source line Vcc, the collector thereof is connected to the base of the transistor Q2 and the base thereof is adapted to receive a driving signal. The transistor Q2 is an NPN type transistor, the collector thereof is connected to the power source line Vcc, and the emitter thereof is connected to a output terminal 2 and the collector of the transistor Q3. The transistor Q3 is an NPN type transistor which turns on during a short braking operation, the emitter thereof is connected to a GND line to ground the same and the base thereof is adapted to receive a control signal for a short braking. To the output terminal 2 a three phase motor such as for a fan is connected.

A motor driving circuit for only one selected phase is explained hereinbelow, because those for the other two phases are identical to that explained. For driving the motor 1 the transistor Q1 at a drive stage for the first time is turned on and in response thereto the transistor Q2 at the output stage is turned on to allow a current flow to the motor 1 from the power source line Vcc via transistor Q2. As a result the motor is driven.

In order to stop the motor 1, the motor 1 has to enter into a short braking condition in which the transistor Q1 is turned off and the transistor Q3 at the output stage is turned on, and thereby the output terminal 2 is conductively connected to the GND terminal. As a result, the current flowing through the motor 1 flows toward the GND line. Further, by turning off the transistor Q1, the transistor Q2 is turned off and the current from the power source line Vcc to the motor 1 is interrupted.

During the short braking operation, a counter electromotive force is generated in the motor and the potential of the output terminal 2 is rendered negative. At this moment, a parasitic transistor Q4 indicated by dotted line in FIG. 6 turns on. As a result, the base potential of the transistor Q1 lowers and the transistor Q1 is turned on. Subsequently, the transistor Q2 also turns on. The parasitic transistor Q4 is formed by the base 6 of the transistor Q1 a its collector, a P type substrate 3 as its base and the collector 7 of the transistor Q3 as its emitter. When the transistor Q2 is turned on, a large current flows into the transistor Q2. Therefore when such a motor drive circuit is formed in an IC, a large current flows into the transistor Q2 during a short braking operation, which possibly damages the transistor Q2.

SUMMARY OF THE INVENTION

Features of a motor driving circuit according to the present invention, in which a first transistor at a drive stage, a second transistor at an output stage driven by the first transistor and a third transistor disposed downstream of the output stage for a short braking operation are formed in a common substrate or a common well of a substrate, are: to provide a region of a P type or an N type in either the common substrate or the common well, to form a parasitic transistor by connecting the region with the first transistor via a conductor and using either the substrate or the well as its base, and to sink a current flowing from the first transistor to the second transistor during the short braking operation by turning on the parasitic transistor.

When the parasitic transistor is formed as indicated above to sink the current flowing from the first transistor to the second transistor during a short braking operation, the parasitic transistor turns on together with or in advance of another parasitic transistor to flow current of the first transistor toward the output terminal via the formed parasitic transistor and further toward the motor side or the GND line side. Thereby a turning on of the second transistor is prevented. As a result, a large current flow through the second transistor at the output stage during a short braking operation is eliminated to prevent the second transistor at the output stage from being damaged.

Accordingly, an object of the present invention is to provide a motor drive circuit suitable for forming in an IC to prevent a transistor at the output stage from being damaged during a short braking operation.

Another object of the present invention is to provide a reliable motor driving system driven by a motor drive circuit formed in an IC to prevent a transistor in the output stage from being damaged.

BRIEF DESCRIPTION OF THE DRAWINGS

Further objects, features and advantage of the present invention are set forth in the description of the preferred embodiment shown in the accompanying drawings, wherein.

DESCRIPTION OF THE PREFERRED EMBODIMENTS

Figure 1:
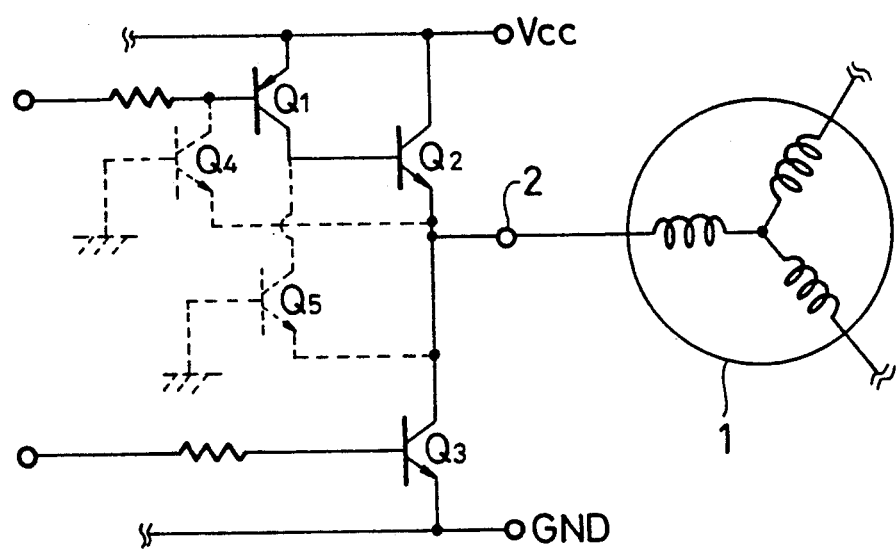
FIG. 1 is a circuit diagram of one embodiment of motor drive circuits according to the present invention.
Figure 2:
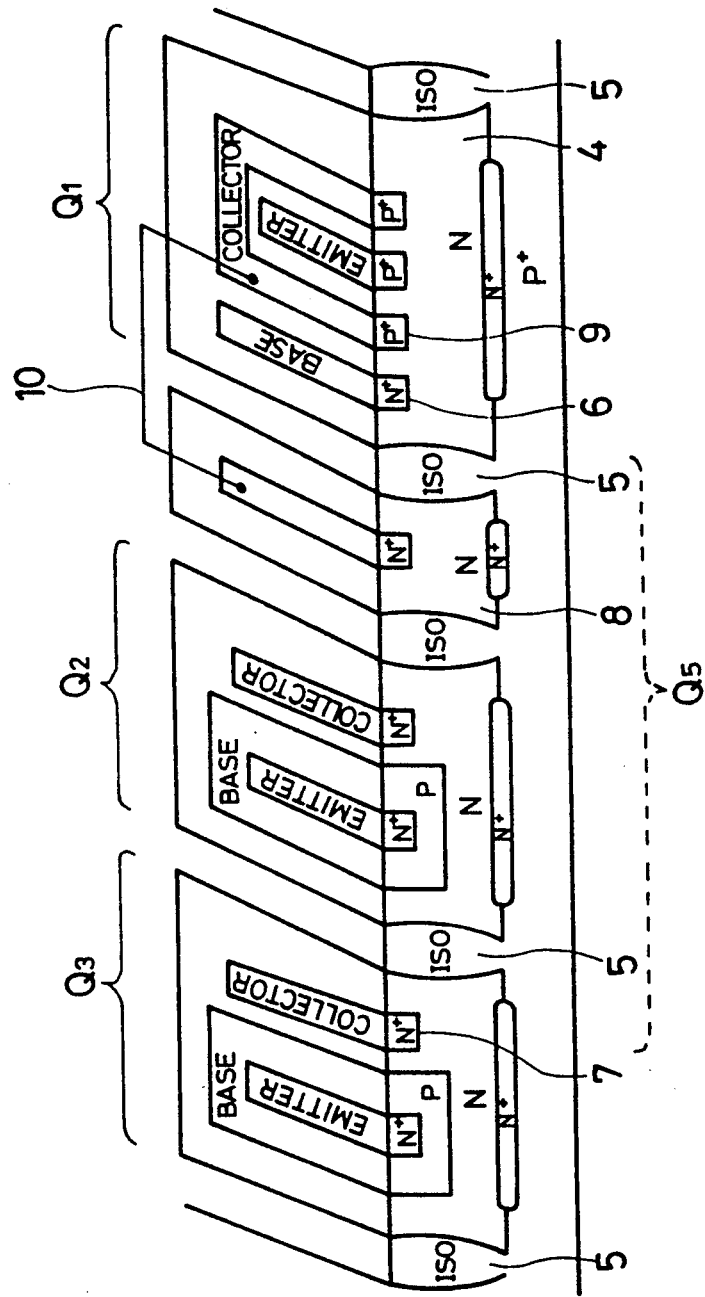
FIG. 2 is an explanatory view showing a structure on a semiconductor chip of the motor drive circuit shown in FIG. 1, when the same is formed in an IC.
Figure 7:
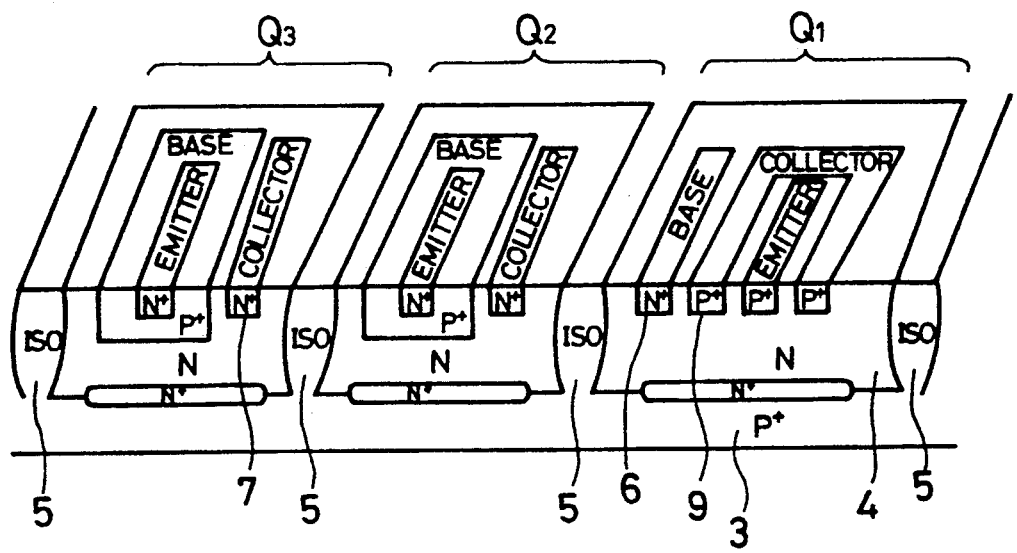
FIG. 7 is an explanatory view showing a structure on a semiconductor chip of the conventional motor drive circuit shown in FIG. 6, when the same is formed in an IC.

Differences of an embodiment shown in FIG. 2, which shows a structure on a semiconductor chip of a transistor Q1 at the drive stage and transistors Q2, Q3 at the output stage in a motor drive circuit shown in FIG. 1, from the conventional motor drive circuit shown in FIG. 7, which shows a similar structure on a semiconductor chip, are: that an N type region 8 is formed between the transistor Q1 and the transistor Q3; further that between each of the transistors Q2, Q1 and the N type region 8 there are provided respective separations of an isolation region or an isolation layer 5, (1S0); and still further that the N type region 8 is connected to the collector 9 of the transistor Q1 via a conductor 10. Since the connection via the conductor 10 is carried out on a layer above the illustrated layer, the conductor 10 is illustrated only by a solid line.

With the provision of the N type region 8 between the transistor Q1 and the transistor Q2 (or the transistor Q3), a new parasitic transistor Q5 of an NPN type is formed in which the N type region 8 serves as its collector, the P type substrate serves as its base and the collector region 7 of the transistor Q3 serves as its emitter. Moreover the collector side of the newly formed parasitic transistor is connected with the collector side of the transistor Q1 via the conductor 10 and the emitter side thereof is connected to the terminal 2 via the collector 7 of the transistor Q3.

Such parasitic transistor Q5, in a short braking condition, is turned on when the output terminal 2 is at a negative potential, in that the collector 7 (see FIG. 2) of the transistor Q3 is at a negative potential. At this moment, the parasitic transistor Q4 also turns on; however, since the collector of the parasitic transistor Q4 (serving as the base 6 of the transistor Q1) is located more remotely from the emitters of the parasitic transistors Q4 and Q5 (connected at the output terminal 2) than the collector (N type region) 8 of the parasitic transistor Q5, the parasitic transistor Q5 turns on earlier than the parasitic transistor Q4.

Therefore, during a short braking operation, the collector current of the transistor Q flows to the output terminal via the parasitic transistor Q5 before the parasitic transistor Q4 can turn on. As a result, no sufficient current necessary for driving the transistor Q2 flows toward the base of the transistor Q2 at the output stage. The transistor Q2 is prevented from being turned on.

Figure 3:
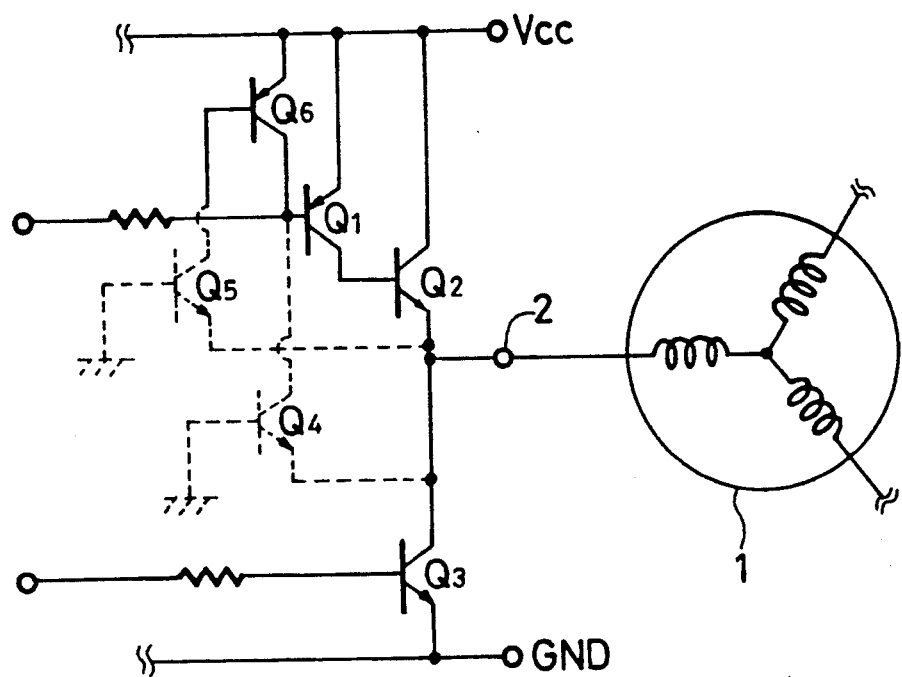
FIG. 3 is a circuit diagram of another embodiment of motor drive circuits according to the present invention.
Figure 4:
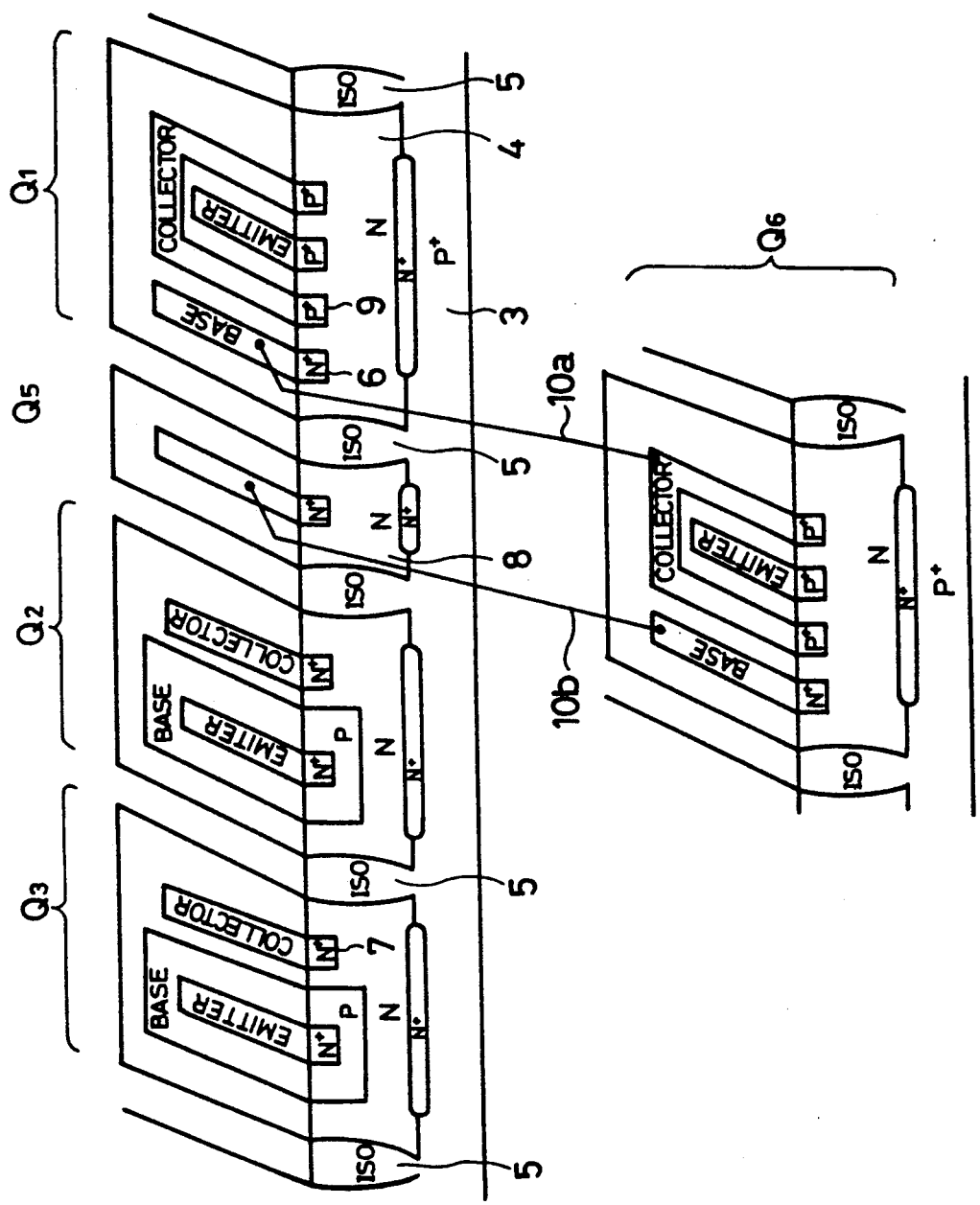
FIG. 4 is an explanatory view showing a structure on a semiconductor chip of the motor drive circuit shown in FIG. 3, when the same is formed in an IC.
Figure 6:
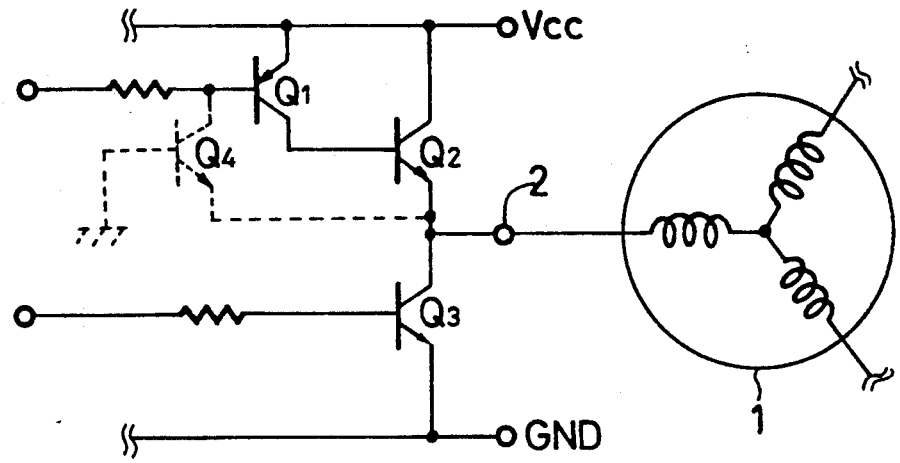
FIG. 6 is a circuit diagram of a conventional motor drive circuit.

FIG. 3 and FIG. 4 show the circuit diagram and structure of another embodiment of the present invention. The differences of the present embodiment from the structure shown in FIG. 6 and FIG. 7 are: that the N type region 8 is formed between transistor Q1 and transistor Q3 as in FIG. 2, and further that a transistor Q6 is formed in another region. The base of the transistor Q6 is connected to the N type region 8 via a conductor 10b and the collector thereof is connected to the base of the transistor Q1 via a conductor 10a.

In the present embodiment, since the collector of the parasitic transistor Q5 is connected to the base of the transistor Q6, during a short braking operation the transistor Q5 is turned on when the output terminal 2 is negative, in that the collector region 7 of the transistor Q3 is negative. At this moment, the parasitic transistor Q4 is also turned on as explained previously, however the parasitic transistor Q5 turns on earlier than the parasitic transistor Q4. Thereby the transistor Q6 turns on. Fur this reason, the collector current of the parasitic transistor Q4 is supplied from the collector of the transistor Q6, and a current flow toward the base of the transistor Q1 a the drive stage necessary for driving the same is suppressed, so that turning on of the transistor Q1 is prevented. As a result, the transistor Q2 at the output stage is difficult to turn on or prevented from turning on.

Figure 5:
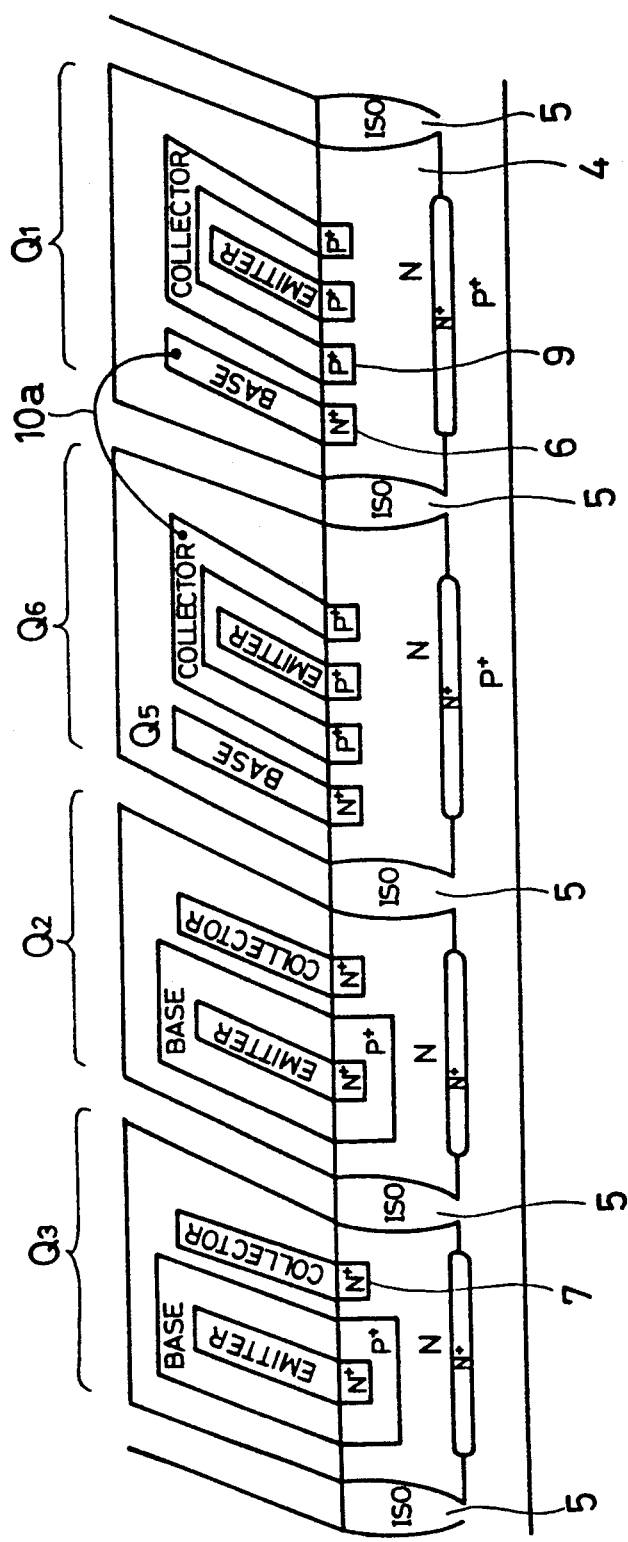
FIG. 5 is an explanatory view showing another structure on a semiconductor chip of the motor drive circuit shown in FIG. 3, when the same is formed in an IC.

FIG. 5 shows a still further embodiment of the present invention. Differences of the FIG. 5 embodiment from that of the previous embodiments are: that the transistor Q6 (which was formed in the other region in FIG. 4) is formed between the transistor Q1 and the transistor Q3, and the N type region 8 of FIGS. 2 and 4 is replaced by transistor Q6. The independently formed N type region 8 in FIG. 4 is the base of the transistor Q6 in FIG. 5. Thereby the semiconductor chip area is reduced for FIG. 5 as compared to FIG. 4 and the conductor 10b of FIG. 4 is omitted in FIG. 5. The circuit diagram and the operation of the FIG. 5 embodiment are the same as that shown in and described with respect to FIG. 3.

Hereinabove, the motor drive circuits were explained, however the circuits explained in the respective embodiments are suitable for forming in an IC, so that the circuits are easily mounted on a substrate for a motor driving circuit or a motor periphery. Accordingly, the present invention is used as a motor driving system including the motor 1.

As will be understood from the above explanation, it is satisfactory if the parasitic transistor Q5 turns on before a large current begins to flow through the transistor Q2 at the output stage and it is not necessarily needed that the parasitic transistor Q5 turns o earlier than the parasitic transistor Q4. Therefore the N type region 8 providing the collector for the parasitic transistor Q5 or the transistor Q6 may be located any place. However, when the N type region 8 or the transistor Q6 is located between the transistor Q1 at the drive stage and the transistor Q2 at the output stage as in the above embodiments, a more reliable operation of the circuit is achieved.

Further, in the above embodiments, an NPN transistor is used for the transistor Q2 at the output stage, however a PNP type transistor may be used therefor. However in such instance, an N type substrate has to be used, the transistors at the drive stage have to be changed to NPN type and the type of the other transistors has to be changed accordingly, and further, the potential of the power source line is set at a negative voltage.

Still further, in the above embodiments the transistors constituting the motor drive circuit are directly formed in the common substrate, however, the transistors may be formed in a common well provided in the substrate.

Further embodiments, modifications and variations are contemplated within the spirit and scope of the following claims.

We claim:

1. A motor drive circuit formed in an IC, comprising:
    a first transistor at a drive stage and formed in a portion in common substrate or a common well of a substrate;
    a second transistor at an output stage formed in the portion to be driven by said first transistor;
    a third transistor for a short braking operation formed in the portion downstream of said second transistor; and
    a region of either a P type or an N type formed in the portion and connected to said first transistor to form a parasitic transistor in which said region serves as emitter or collector and the portion serves as base.

2. A motor drive circuit formed in an IC, comprising:

a first transistor at a drive stage;

a second transistor at an output stage and connected to be driven by the first transistor;

a third transistor connected for a short braking operation and disposed downstream the output stage;

said first transistor, second transistor and third transistor are formed in a common substrate or a common well of a substrate;

a region of a P type or an N type in said common substrate or said common well;

a conductor internally connecting said region with said first transistor to form a parasitic transistor with said common substrate or said common well as a base.

3. A motor drive circuit formed in an IC, comprising:

a first transistor of a PNP type having an emitter connected to a power source line;

a second transistor of a NPN type with a collector connected to the power source line, a base connected to the collector of the first transistor and an emitter connected to an output terminal;

a third transistor of a PNP type with a collector connected to the output terminal and an emitter connected to a ground line;

said first, second and third transistor are formed in a common substrate or a common well of a substrate;

an N type region in said common substrate or said common well;

a conductor connecting said N type region to the first transistor so that said N type region serves as a collector of a parasitic transistor in which the common substrate or the common well serves as a base.

4. A motor drive circuit according to claim 3, wherein said N type region is formed between the second transistor and the third transistor; and further comprising an isolation region or an isolation layer surrounding said N type region.

5. A motor drive circuit formed in an IC, comprising:

a first transistor of a NPN type having a collector connected to a power source line;

a second transistor of a PNP type with an emitter connected to the power source line, a base connected to the emitter of the first transistor and a collector connected to an output terminal;

a third transistor of an NPN type with an emitter connected to the output terminal and a collector connected to a ground line;

said first, second and third transistor are formed in a common substrate or a common well of a substrate;

a P type region in said common substrate or said common well;

a conductor connecting said P type region to the first transistor so that said P type region serves as a an emitter of a parasitic transistor in which the common substrate or the common well serves as a collector.

6. A motor drive circuit, comprising:

a first transistor of a PNP type with an emitter connected to a power source line;

a second transistor of an NPN type with a collector connected to the power source line, a base connected to the collector of the first transistor and an emitter connected to an output terminal;

a third transistor of a PNP type with a collector connected to the output terminal and an emitter connected to a ground line;

an N type region;

and a fourth transistor of a PNP type with an emitter connected to the power source line;

a base connected with said N type region and a collector connected with the base of the first transistor, said first transistor, said second transistor, said third transistor, said fourth transistor and said region are formed in a common substrate or a common well of a substrate; and said N type region constitutes a collector of a parasitic transistor in which said common substrate or said common well serves as a base.

7. A motor drive circuit according to claim 6, wherein the base of said fourth transistor is incorporated in said N type region.

8. A motor drive circuit according to claim 6, wherein said fourth transistor is formed between the first transistor and the third transistor and is surrounded by an isolation region or an isolation layer, the base of said fourth transistor serves as a collector for the parasitic transistor and the common substrate or the common well serves as a base of the parasitic transistor.

9. A motor drive system, comprising:

a first transistor at a drive stage formed in a portion in a substrate or a well of a substrate;

a second transistor at an output stage formed in the portion and connected to be driven by said first transistor;

a motor connected to said second transistor;

a third transistor connected for a short braking operation formed in the portion and disposed downstream said second transistor; and a region of a P type or an N type formed in the portion and internally connected to said first transistor to form a parasitic transistor with said region as an emitter or a collector and the portion as a base.

10. A motor drive system, including:

a motor drive circuit having first, second and third transistors formed in a common substrate or a common well of a substrate as an IC;

said first transistor at a drive stage;

said second transistor at an output stage and connected to be driven by the first transistor;

said third transistor being connected for a short braking operation and disposed downstream the output stage;

a motor connected to be driven by the motor drive circuit;

said motor drive circuit further provided with a region of a P type or an N type in said common substrate or said common well, and a conductor internally connecting said region with said first transistor to form a parasitic transistor with a base as said common substrate or said common well.

11. A motor drive system, including:

a motor drive circuit having first, second and third transistors formed in a common substrate or a common well of a substrate as an IC;

said first transistor being of a PNP type with emitter connected to a power source line;

said second transistor being of an NPN type with collector connected to the power source line, base connected to the collector of the first transistor, and emitter connected to an output terminal;

said third transistor being of a PNP type with collector connected to the output terminal and emitter connected to a ground line;

a motor connected to the output terminal;

said motor drive circuit further having a N type region in the common substrate or the common well, a conductor connecting said N type region to the first transistor, and a parasitic transistor with said N type region as collector and the common substrate or the common well as base.

12. A motor drive circuit, comprising:
a first power supply line;
a second power supply line;
a first input to receive a signal for controlling the supply of current to a motor;
an output for supplying current to the motor;
a second input for receiving a short braking operation signal;
a power transistor connected between said first power supply line and said output for providing driving current to the motor, and having a control;
a drive transistor connected between said first power supply line and said control of said power transistor, and having a control connected to said first input;
a short braking operation transistor connected between said output and said second power supply line and having a control connected to said second input;
all of said transistors being formed in a common substrate or a common well in a substrate as an integrated circuit so that a parasitic transistor exists between the control of said drive transistor and said output, with said parasitic transistor being partly formed by the common substrate or the common well in a substrate so that the parasitic transistor will tend to operate during short braking operation when the output becomes negative due to back emf from the motor, to operate the drive transistor for turning on the power transistor; and
at least one further transistor in said integrated circuit for operating only during short braking operation in response to the back emf producing a negative voltage at the output and connected to the control of one of said drive transistor and said power transistor for preventing said power transistor from being turned on by said parasitic transistor during short braking operation when the output becomes negative.

13. The circuit of claim 12, wherein said further transistor is a parasitic transistor having a dedicated one of an N and a P region integrated between regions of said drive transistor and one of said power and short braking operation transistors.

14. The circuit of claim 13, wherein said further transistor is a parasitic transistor having a control in common with the control of the first mentioned parasitic transistor.

15. The circuit of claim 14, wherein said further transistor is a parasitic transistor connected between the control of said power transistor and said output, and has a control constituted by said common substrate or said common well of a substrate.

16. The circuit of claim 12, wherein said further transistor is a parasitic transistor having a control in common with the control of the first mentioned parasitic transistor.

17. The circuit of claim 12, wherein said further transistor is a non-parasitic transistor connected between one of said power supply line and the control of one of said drive transistor and said power transistor.

18. The circuit of claim 12, wherein said further transistor is connected between said first power supply line and the control of said drive transistor, and has a control connected through another parasitic transistor to said output, with said another parasitic transistor having a control common with the control of the first mentioned parasitic transistor.

19. The circuit of claim 12, wherein said further transistor is a parasitic transistor connected between the control of said power transistor and said output, and has a control constituted by said common substrate or said common well of a substrate.

20. The motor drive circuit of claim 12, and further including:
a motor having a coil connected to said output.

21. The circuit of claim 12, wherein said further transistor is a parasitic transistor having a dedicated one of an N and a P region integrated between regions of said drive transistor and one of said power and short braking operation transistors, and said parasitic transistor further having a conductor connected to one of others of said transistors.

22. The circuit of claim 21, wherein said further transistor has a control in common with the control of said first mentioned parasitic transistor and constituted by said common substrate or said common well in a substrate.

23. The circuit of claim 22, further including a non-parasitic transistor connected between one of said power supply lines and the control of one of said drive transistor and said power transistor for operating together with said second mentioned parasitic transistor only during short braking operation and response to the back emf producing a negative voltage at the output for preventing said power transistor from being turned on by said first mentioned parasitic transistor during short braking operation when the output becomes negative.

24. The motor drive circuit of claim 23, and further including a motor having a coil connected to said output.

25. The motor drive circuit of claim 23, and further including:
a plurality of additional identical ones of the motor drive circuit; and
a motor having a corresponding plurality of coils respective connected to the outputs of said plurality of motor drive circuits.

* * * * *